(12) United States Patent
Fletcher et al.

(10) Patent No.: US 6,433,981 B1
(45) Date of Patent: Aug. 13, 2002

(54) MODULAR CURRENT SENSOR AND POWER SOURCE

(75) Inventors: David G. Fletcher, Simsbury; Farshid Attarian, Collinsville; Edward E. Kim, Burlington; Esteban Santos, Farmington, all of CT (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/475,617

(22) Filed: Dec. 30, 1999

(51) Int. Cl.$^7$ ................................ H02H 3/00; H02J 3/12
(52) U.S. Cl. ..................... 361/93.1; 361/18; 323/234
(58) Field of Search ..................... 361/18, 93.1, 93.5, 361/9; 363/56.03, 50, 25, 74, 78; 323/234, 265

(56) References Cited

U.S. PATENT DOCUMENTS

| | | | |
|---|---|---|---|
| 4,591,942 A | | 5/1986 | Willard et al. |
| 4,672,501 A | | 6/1987 | Bilac et al. |
| 4,914,541 A | * | 4/1990 | Tripodi et al. ............... 361/86 |
| 4,992,723 A | * | 2/1991 | Zylstra et al. ............. 323/324 |
| 5,583,732 A | | 12/1996 | Seymour et al. |
| 5,615,075 A | | 3/1997 | Kim |
| 5,726,846 A | | 3/1998 | Houbre |
| 6,141,197 A | * | 10/2000 | Kim et al. ................... 361/102 |

FOREIGN PATENT DOCUMENTS

| | | |
|---|---|---|
| DE | 34 41 403 A | 5/1986 |
| EP | 0 416 422 A1 | 3/1991 |
| EP | 0 614 136 A1 | 9/1994 |

* cited by examiner

Primary Examiner—Kim Huynh
(74) Attorney, Agent, or Firm—Cantor Colburn LLP

(57) ABSTRACT

A modular current sensor and power source unit (10) for duplicating the function of a current transformer is disposed on a conductor (11) of an electrical circuit. Modular current sensor and power source unit (10) includes a current transformer (12), a power supply circuit (14), a current sensor (16), and current source circuit (18). Current transformer (12) provides operating power to power supply circuit (14). Power supply circuit (14) regulates the operating power and provides the regulated operating power to sensor (16) and current source (18). Sensor (16) senses current in phase (11) and provides a signal indicative of the current in phase (11) to current source (18). Current source (18) receives the signal from sensor (16) and drives an output current proportional to this signal to the load circuit via lines (34) and (36). The current output by current source (18) has the attributes of the low power sensor (16) with the ability to provide power to the load circuit.

18 Claims, 2 Drawing Sheets

MODULAR CURRENT SENSOR AND POWER SOURCE

BACKGROUND OF THE INVENTION

This invention relates to current sensors for duplicating the function of a current transformer, and more particularly, to a modular current sensor and power source.

Current transformers are used to perform various functions in electrical circuits. Current transformers may be disposed on a primary electrical circuit to provide variable electrical power to a secondary electrical circuit. Current transformers may also be used as a sensor to sense electrical current in a primary electrical circuit and provide a signal indicative of the magnitude of the current to a secondary electrical circuit. In some applications, a single current transformer is used to perform both of these functions. However, there are fundamental limitations to the performance of conventional iron core current transformers. Iron core current transformers designed for wide dynamic range require large, heavy and costly iron cores and copper conductors. Further, the accuracy and linearity of iron core current transformers is inherently limited by saturation and magnetic losses. As a result, conventional iron core current transformers tend to be expensive, with somewhat limited accuracy.

One application where a single current transformer may be used to provide both operating power and a current signal to a secondary circuit is in an electrical circuit breaker having an electronic trip unit. Electronic trip units are employed in industrial-rated circuit breakers for a wide variety of protection and other accessory functions. One such electronic trip unit is described in U.S. Pat. No. 4,672,501 entitled Circuit Breaker and Protective Relay Unit.

An advantage of using a single current transformer to perform both power and sensing functions is the simplicity of a two-wire connection between the current transformers and the sensing circuitry (e.g. the trip unit). The sensing circuitry receives the sensing signal and power from two wires. One example of an efficient current transformer used for both sensing and power functions is described in U.S. Pat. No. 4,591,942 entitled Current Sensing Transformer Assembly.

Various patents describe the use of two devices, one for power and one for sensing, to overcome the aforementioned design limitations inherent in using a single transformer. For example, the use of the combination of an air core transformer for current sensing and an iron core transformer for providing operating power is found in U.S. Pat. No. 5,583,732 entitled Modular Current Transformer for Electronic Circuit Interrupters. U.S. Pat. No. 5,615,075 entitled AC/DC Current Sensor for a Circuit Breaker, describes the use of a Hall effect device for current sensing in combination with an auxiliary power supply for providing operating power to the trip unit processor. However, previously, when sensing devices such as an air core current transformer, Hall effect device and the like are employed for the current sensing function, four wires have been required, two for providing power from the power transformer to the power supply circuitry and two for providing signals from the sensing device to the sensing circuitry. The added wires can increase the cost to manufacture new devices. Moreover, the need for additional wires precludes using such current sensors with existing applications having a two conductor input.

BRIEF SUMMARY OF THE INVENTION

In an exemplary embodiment of the invention, a modular current sensor and power source unit are combined in a configuration duplicating the function of a current transformer. The invention consists of a sensing circuit, a power source, a power supply, and a current source combined and connected to an electrical distribution circuit and electrical device. In this case a current transformer is used as the power source. A power supply circuit connects with the current transformer for regulating the operational current input. A current sensor circuit is arranged for connection with the electrical distribution circuit for providing a signal indicative of current flow through the electrical distribution circuit. A current source circuit connects with the current sensor circuit for receiving the current signal and with the power supply circuit for receiving the operational current from the power supply circuit. The current source circuit connects with an electrical device for providing the operational current and the current signal to the electrical device.

DETAILED DESCRIPTION OF THE INVENTION

Figure 1:
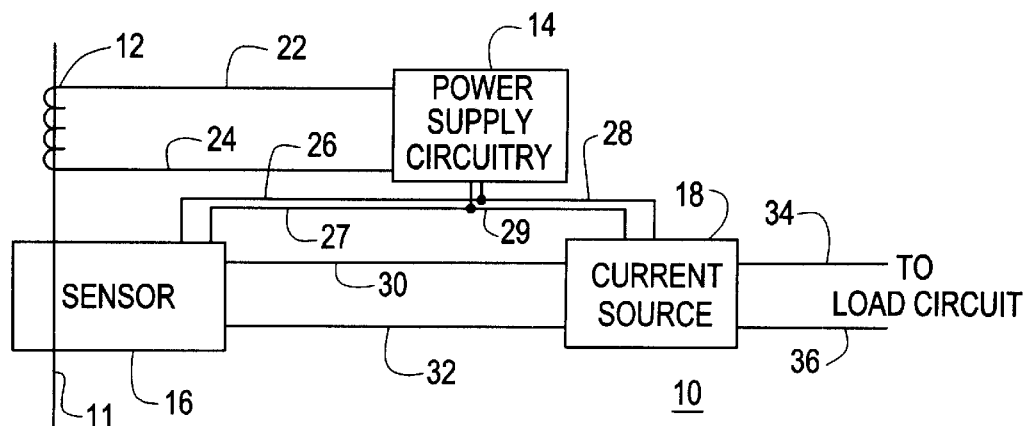
FIG. 1 is a block diagram of a modular current sensor and power source unit of the present invention.

Referring to FIG. 1, a modular current sensor and power source unit of the present invention is shown at 10. Modular current sensor and power source unit 10 is disposed on an electrical conductor, such as a phase 11 of an electrical circuit to provide variable electrical power to a load circuit (electrical device) via lines 34 and 36. Modular current sensor and power source unit 10 also senses electrical current in phase 11 and provides a signal indicative of the magnitude of the current in phase 11 to the load circuit via lines 34 and 36. Modular current sensor and power source unit 10 thus can be used to replace a conventional current transformer (not shown) to provide both operating power and a current signal to the load circuit via two lines 34 and 36.

Modular current sensor and power source unit 10 includes a current transformer 12, a power supply circuit 14, a current sensor 16, and current source circuit 18. Within modular current sensor and power source unit 10, current transformer 12 is disposed about one phase 11 of an electrical distribution circuit. Current transformer 12 is electrically connected to power supply circuit 14 via lines 22, 24, and power supply circuit 14 is electrically connected to current sensor 16 and current source circuit 18 via lines 26–29. Current sensor 16 is disposed about phase 11. Current sensor 16 is electrically connected to current source circuit 18 via lines 30, 32. Current source circuit 18 is electrically connected to the load circuit via lines 34, 36. Current sensor 16 may include, for example, an air core transformer, Hall effect device or a giant magnetoresistive (GMR) device. While the embodiment described herein shows current sensor 16 electrically connected to power supply circuit 14, this connection may be removed or modified depending on which type of current sensor 16 (e.g. air core transformer, Hall effect device or GMR device) is used. Additionally, the embodiment shown employs a current transformer 12, however, other power sources may be used as well.

During operation, current transformer 12 provides operating power to power supply circuit 14 via lines 22 and 24. Power supply circuit 14 regulates this operating power and provides the regulated operating power to sensor 16 and current source 18 via lines 26–29. Sensor 16 senses current in phase 11 and provides a current sensor output signal indicative of the current in phase 11 to current source 18 via lines 30 and 32. Current source 18 receives the current sensor output signal and drives a current source circuit output signal, which is an output current indicative of the current sensor output signal, to the load circuit via lines 34 and 36. The source circuit output signal has the attributes of the low power sensor and the ability to provide power to the load circuit.

Because sensor 16 is not required to provide operating power to current source 18 or to the load circuit, sensor 16 can comprise any of a number of higher performance current sensing devices such as, for example, an air core transformer, Hall effect device or GMR device. In addition, because transformer 12 is not required to provide a sensed signal to the load circuit, transformer 12 can be optimized for providing power.

Figure 2:
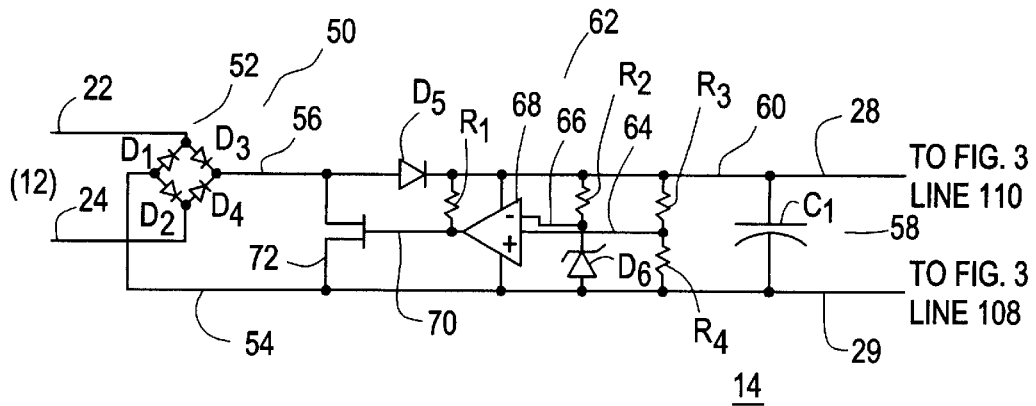
FIG. 2 is a diagrammatic representation of the circuit components used with the power supply circuit of the modular current sensor and power source unit of FIG. 1.

FIG. 2 is a circuit diagram of power supply circuit 14. Power supply circuit 14 is a voltage regulated, full wave bridge rectifier with a simple capacitor filter. Current from the current transformer 12 provides the input to a full wave bridge rectifier 50 including bridge diodes 52 comprising diodes D1, D2, D3, and D4. The full wave bridge rectifier 50 creates a power supply negative power rail on a line 54 and an unfiltered and unregulated positive output voltage on a line 56. Diode D5 connected in series between the unfiltered output voltage on line 56 and the regulated output voltage on line 60 prevents current flow from capacitor C1 58 back to the regulator transistor 72. A filter section 58 for reducing the ripple of the unfiltered output voltage on line 56 is represented by the capacitor C1 connected between positive power rail 60 and negative power rail 54, creating a filtered output voltage on positive power rail 60. A regulator section 62 assures the filtered output voltage provides a constant voltage level to sensor 16 and current source 18 on positive power rail line 60. Resistor R2 and zener diode D6 are connected in series between the positive and negative voltage rails 60 and 54, respectively. These provide a reference voltage on a line 66 that is connected to a negative input terminal of a comparator 68. A voltage divider comprising resistors R3 and R4 connected in series is connected between the positive and negative voltage rails 60 and 54, respectively. The voltage divider provides a sample output voltage on a line 64 that fluctuates with the voltage level on the positive output rail 60. The sample output voltage on line 64 is connected to a positive input terminal of comparator 68. Comparator 68 generates a logic signal 70 which indicates whether the positive output rail 60 is above or below the desired regulated voltage. A source and drain of a field effect transistor (FET) 72 are connected to unfiltered voltage on line 56 and negative voltage rail 54 respectively. The logic signal 70 drives the gate of FET 72 thereby shunting current through the FET 72 when the positive output rail is above the desired voltage and thus regulating the output voltage on line 60.

Figure 3:
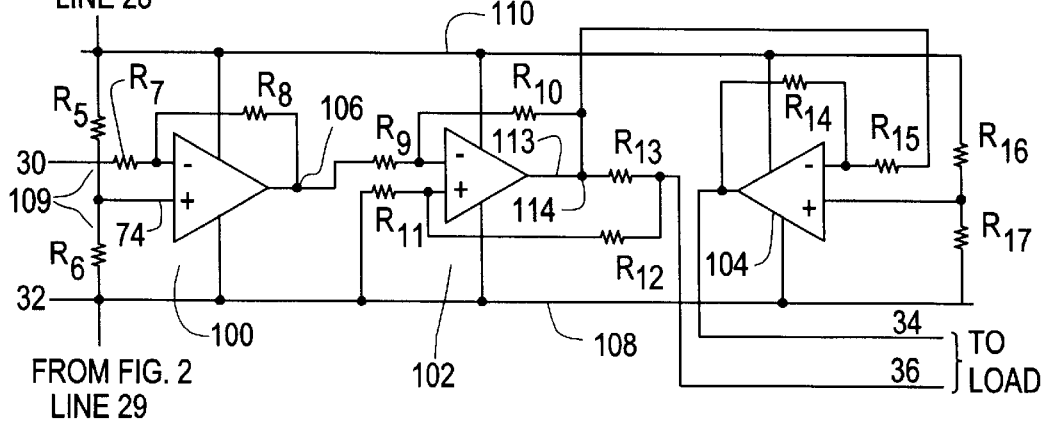
FIG. 3 is a diagrammatic representation of the circuit components used within the current source unit of FIG. 1.

Referring to FIG. 3, a circuit diagram of current source circuit 18 is shown. Most types of higher performance current sensors 16 provide a low voltage output signal proportional to the current input. Current source circuit 18 includes a voltage amplifier stage 100 and bridge type current source formed from operational amplifers 102 and 104. The voltage amplifier 100 is comprised of an input from the current sensor 16 on line 30 connected to a resistor R7 that is thence connected to the inverting input of an operational amplifier 100. Feedback resistor R8 connects an output of op-amp 100 on a line 106 and to the inverting input of op-amp 100. A voltage divider 110, formed from series connected resistors R5 and R6 arranged between the positive and negative rails 60, 54 of voltage supply circuit 14, provides a DC voltage at the connection of R5 to R6 on a line 74, which is applied to the non-inverting input of op-amp 100. The output of op-amp 100 on line 106 is provided to operational amplifier 102, via a resistor R9 connected to the inverting input of an op-amp 102 configured as a current source. Feedback resistor R10 connects an output of op-amp 102 on a line 114 to the inverting input of op-amp 102. The output of op-amp 102 on line 114 is connected to a resistor R13, which is connected to line 36. A resistor R12 is connected to line 36 and to the non-inverting input of op-amp 102. A second resistor R11 connects the non inverting terminal of operational amplifier 102 to the negative power supply rail 108. A third operational amplifier, 104, is connected as a unity gain inverter and provides a signal of opposite polarity to that provided by the second operational amplifier, 102. Resistors R14 connected between the inverting input and output of the third operational amplifier 104 and R15 connected between the output of the second operational amplifier 102 and the inverting input of the third operational amplifier 104 set the gain of inverting operational amplifier 104. Resistors R16 and R17 connected between the positive terminal of the power supply 60, and the negative terminal of the power supply, 54 and the non inverting input of operational amplifier 104 set the bias point of operational amplifier 104. Lines 34 and 36 provide a current output to the load circuit, the current output having the attributes of the sensor 16 input on lines 30, 32 and with sufficient power to drive the load circuit.

Figure 4:
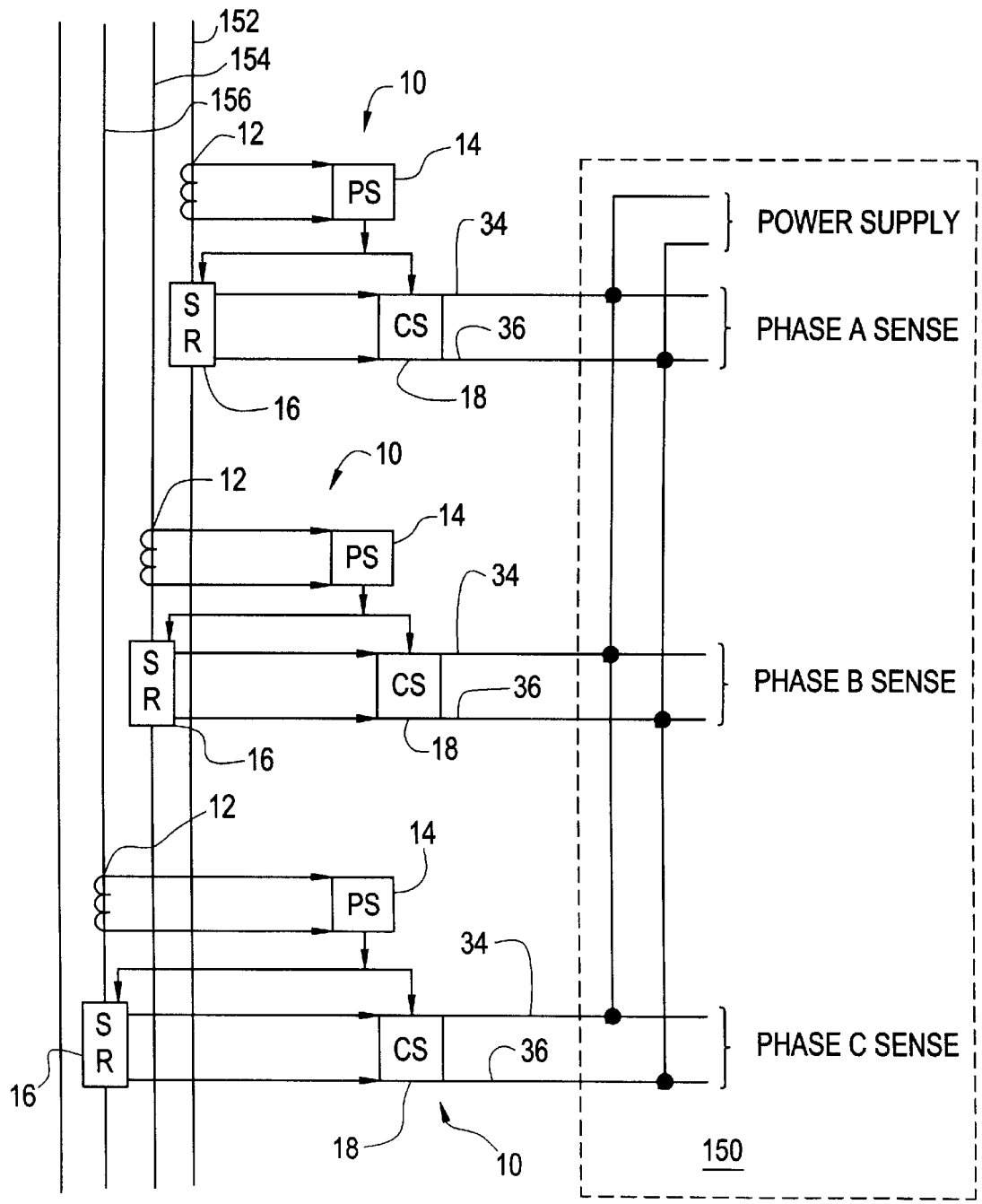
FIG. 4 is a diagrammatic representation of an electronic trip unit employing the modular current sensor and power source unit of the present invention.

FIG. 4 is a diagrammatic representation of a circuit breaker trip unit 150 employing a plurality of modular current sensor and power source units 10 of the present invention. Circuit breaker trip unit 150 is similar to that described in the aforementioned U.S. Pat. No. 4,672,501, which is incorporated by reference. As can be seen in FIG. 4, each modular current sensor and power source unit 10 is disposed about a phase 152, 154, 156 of a multi-phase power distribution circuit. Each modular current sensor and power source unit 10 is independently connected to the circuit breaker trip unit 150 via two conductors 34 and 36. Each modular current sensor and power source unit 10 provides operating power to circuit breaker trip unit 150 via lines 34 and 36. The operating power from each modular current sensor and power source are effectively combined internally in the circuit breaker trip unit 150 such that each can power the circuit breaker independently. Each modular current sensor and power source unit 10 also provides a current signal indicative of the current in its associated phase 152, 154, or 156 via lines 34 and 36. The current signals from each modular current sensor and power source are maintained separately for each phase internally in the circuit breaker trip unit 150. Operating on power received by units 10, and processing current signals received by the units 10, trip unit 150 detects overcurrent conditions in phases 152, 154, and 156 in a manner described in aforementioned U.S. Pat. No. 4,672,501. Because each modular current sensor and power source unit 10 requires only two lines 34 and 36 for connection with electronic trip unit 150, modular current sensor and power source units 10 can be used to replace current transformers used in conjunction with such trip units.

Modular sensing and power source unit 10 provides the attributes of a highly accurate current sensor while providing operating power to a load circuit without requiring additional wires to be added between the unit and the load source. Thus, modular sensing and power source unit 10 can be used as a replacement for existing current transformers, without having to modify the associated load circuit.

While the invention has been described with reference to a preferred embodiment, it will be understood by those skilled in the art that various changes may be made and equivalents may be substituted for elements thereof without departing from the scope of invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A modular sensing and power source unit for duplicating the function of a current transformer, the modular sensing and power source unit comprising:
    a power source for providing operational power;
    a power supply circuit connecting with said power source for regulating said operational power;
    a current sensor circuit arranged for providing a current sensor output signal indicative of current flow through a conductor; and
    a current source circuit connecting with said current sensor circuit for receiving said current sensor output signal and with said power supply circuit for receiving said operational power from said power supply circuit, said current source circuit being arranged for providing a current source circuit output signal, said current source circuit output signal being proportional to said current sensor output signal and generating said operational power.

2. The modular sensing and power source unit of claim 1 wherein said power source is a current transformer.

3. The modular sensing and power source unit of claim 2 wherein said power supply circuit includes:
    a shunt regulator arranged for connecting with said current source circuit.

4. The modular sensing and power source unit of claim 3 wherein said shunt regulator includes:
    a field effect transistor providing shunt regulation and connecting through a diode to a capacitor.

5. The modular sensing and power source unit of claim 1 wherein said current source circuit includes:
    a first amplifier having a pair of inputs connecting with said current sensor circuit.

6. The modular sensing and power source unit of claim 5 wherein said current source circuit includes a second and third amplifier configured to provide said current source circuit output signal.

7. The modular sensing and power source unit of claim 1 wherein said current sensor circuit includes a current sensor selected from the group consisting of a Rogawski coil, Hall effect device or a GMR.

8. The modular sensing and power source unit of claim 1 wherein said current sensor circuit is further arranged for receiving said operational power from said power supply circuit.

9. The modular sensing and power source unit of claim 1 wherein said current source circuit output signal is generated at a single terminal of said current source circuit.

10. A circuit breaker for providing overcurrent protection to a conductor, the circuit breaker comprising:
    a modular sensing and power source unit including:
        a power source for providing operational power,
        a power supply circuit connecting with said power source for regulating said operational power,
        a current sensor circuit arranged for providing a current sensor output signal indicative of current flow through the conductor, and
        a current source circuit connecting with said current sensor circuit for receiving said current sensor output signal and with said power supply circuit for receiving said operational power from said power supply circuit, said current source circuit being arranged for providing a current source circuit output signal, said current source circuit output signal being proportional to said current sensor output signal and generating said operational power; and
    an electronic trip unit powered by said current source circuit output signal, wherein said electronic trip unit detects an overcurrent condition in the conductor in response to said current source circuit output signal.

11. The circuit breaker of claim 10 wherein said power source is a current transformer.

12. The circuit breaker of claim 11 wherein said power supply circuit includes:
    a shunt regulator arranged for connecting with said current source circuit.

13. The circuit breaker of claim 12 wherein said shunt regulator includes:
    a field effect transistor providing shunt regulation and connecting through a diode to a capacitor.

14. The circuit breaker of claim 10 wherein said current source circuit includes:
    a first amplifier having a pair of inputs connecting with said current sensor circuit.

15. The circuit breaker of claim 14 wherein said current source circuit includes a second amplifier configured to provide said current source circuit output signal.

16. The circuit breaker of claim 10 wherein said current sensor circuit includes a current sensor selected from the group consisting of a Rogawski coil, Hall effect device or a GMR.

17. The circuit breaker of claim 10 wherein said current sensor circuit is further arranged for receiving said operational power from said power supply circuit.

18. The circuit breaker of claim 10 wherein said current source circuit output signal is generated at a single terminal of said current source circuit.

* * * * *